United States Patent
Jeng et al.

(10) Patent No.: US 9,728,637 B2
(45) Date of Patent: Aug. 8, 2017

(54) MECHANISM FOR FORMING SEMICONDUCTOR DEVICE WITH GATE

(71) Applicant: TAIWAN SEMICONDUCTOR MANUFACTURING CO., LTD, Hsin-Chu (TW)

(72) Inventors: Jung-Chi Jeng, Tainan (TW); I-Chih Chen, Tainan (TW); Wen-Chang Kuo, Tainan (TW); Ying-Hao Chen, Tainan (TW); Ru-Shang Hsiao, Jhubei (TW); Chih-Mu Huang, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/080,313

(22) Filed: Nov. 14, 2013

(65) Prior Publication Data

US 2015/0129987 A1    May 14, 2015

(51) Int. Cl.
*H01L 29/66* (2006.01)
*H01L 29/78* (2006.01)
*H01L 29/06* (2006.01)

(52) U.S. Cl.
CPC ...... *H01L 29/7833* (2013.01); *H01L 29/0649* (2013.01); *H01L 29/6659* (2013.01)

(58) Field of Classification Search
CPC ............. H01L 29/6653; H01L 29/7834; H01L 29/66636; H01L 29/6659; H01L 21/8238; H01L 29/78; H01L 29/7848
USPC ........................................................ 257/408
See application file for complete search history.

(56) References Cited

U.S. PATENT DOCUMENTS

| | | | |
|---|---|---|---|
| 5,268,319 A * | 12/1993 | Harari | 438/260 |
| 5,440,161 A | 8/1995 | Iwamatsu et al. | |
| 5,652,454 A | 7/1997 | Iwamatsu et al. | |
| 6,465,332 B1 | 10/2002 | Papadas et al. | |
| 8,232,178 B2 * | 7/2012 | Yin et al. | 438/424 |
| 9,281,215 B2 * | 3/2016 | Jeng | H01L 21/32135 |
| 2002/0009851 A1 * | 1/2002 | Shukuri et al. | 438/257 |
| 2004/0251479 A1 * | 12/2004 | Tsutsui | H01L 21/82380 257/249 |
| 2005/0285137 A1 * | 12/2005 | Satoh | 257/178 |
| 2007/0287240 A1 * | 12/2007 | Chen | H01L 21/82380 438/197 |
| 2008/0036013 A1 * | 2/2008 | Kotani | 257/374 |
| 2008/0083949 A1 * | 4/2008 | Zhu et al. | 257/347 |

(Continued)

*Primary Examiner* — Jarrett Stark
*Assistant Examiner* — Bitew Dinke
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate and an isolation structure in the semiconductor substrate and surrounding an active region of the semiconductor substrate. The semiconductor device also includes a gate over the semiconductor substrate, and the gate has an intermediate portion over the active region and two end portions connected to the intermediate portion, and the end portions are over the isolation structure. The semiconductor device further includes a support film over the isolation structure and covering the isolation structure and at least one of the end portions of the gate. The support film exposes the active region and the intermediate portion of the gate.

20 Claims, 13 Drawing Sheets

(56) References Cited

U.S. PATENT DOCUMENTS

| | | | |
|---|---|---|---|
| 2008/0093673 A1* | 4/2008 | Tamura | H01L 29/7843 257/365 |
| 2008/0128825 A1* | 6/2008 | Sato et al. | 257/369 |
| 2008/0217665 A1* | 9/2008 | Chen | H01L 21/82380 257/288 |
| 2008/0246057 A1* | 10/2008 | Lin | H01L 29/165 257/190 |
| 2009/0194817 A1* | 8/2009 | Lee | H01L 21/82380 257/369 |
| 2009/0230439 A1* | 9/2009 | Wang et al. | 257/288 |
| 2009/0236633 A1* | 9/2009 | Chuang et al. | 257/190 |
| 2011/0114996 A1* | 5/2011 | Fiorenza | H01L 21/26506 257/192 |
| 2011/0169105 A1* | 7/2011 | Okubo | 257/411 |
| 2011/0220964 A1* | 9/2011 | Shin | H01L 21/30608 257/183 |
| 2011/0241071 A1* | 10/2011 | Shin et al. | 257/190 |
| 2012/0108032 A1* | 5/2012 | Yin | H01L 21/76224 438/404 |
| 2012/0302018 A1* | 11/2012 | Shin et al. | 438/198 |
| 2013/0069136 A1* | 3/2013 | Mao et al. | 257/316 |
| 2013/0113047 A1* | 5/2013 | Dhanyakumar et al. | 257/368 |
| 2013/0115743 A1* | 5/2013 | Yin et al. | 438/199 |
| 2013/0217194 A1* | 8/2013 | Pidin | 438/197 |
| 2014/0004695 A1* | 1/2014 | Ando et al. | 438/591 |
| 2014/0110798 A1* | 4/2014 | Cai et al. | 257/410 |
| 2014/0231924 A1* | 8/2014 | Kuo | H01L 29/785 257/401 |
| 2014/0242763 A1* | 8/2014 | Chen et al. | 438/197 |

* cited by examiner

MECHANISM FOR FORMING SEMICONDUCTOR DEVICE WITH GATE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
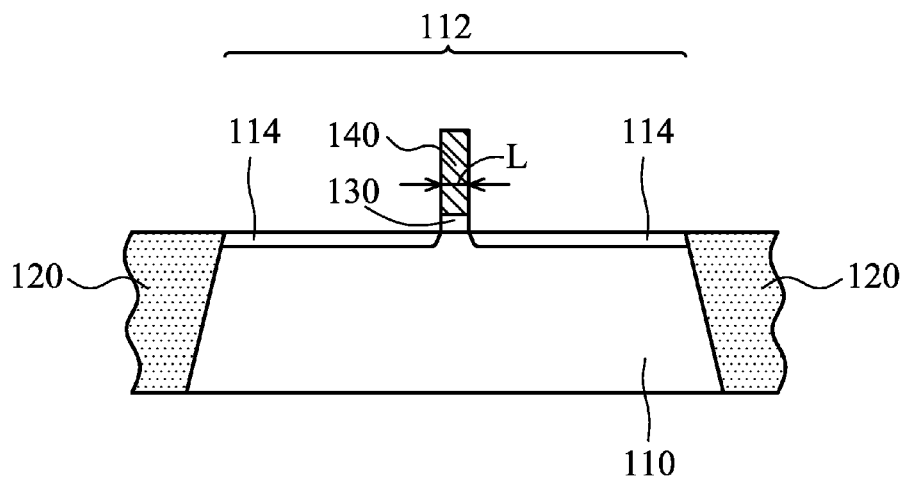
FIGS. 1A-1B are cross-sectional views of various stages of a process for forming a semiconductor device, in accordance with some embodiments.
Figure 1B:
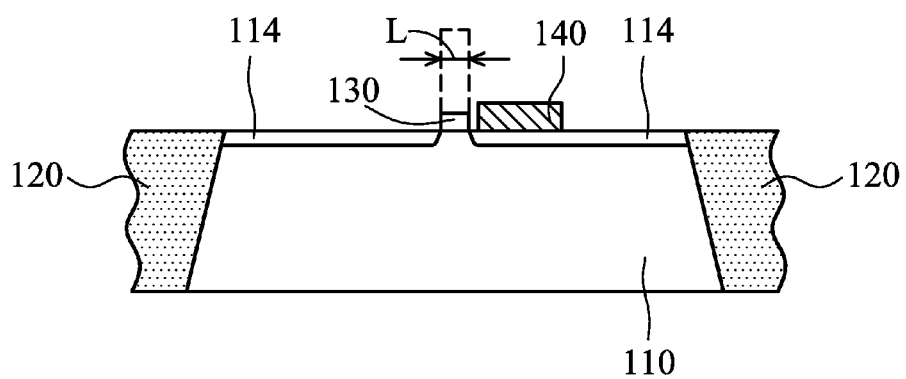

FIGS. 1A-1B are cross-sectional views of various stages of a process for forming a semiconductor device, in accordance with some embodiments. As shown in FIG. 1A, a semiconductor substrate 110 is provided. The semiconductor substrate 110 may be a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

An isolation structure 120 is formed in the semiconductor substrate 110 to define various active regions 112 of the semiconductor substrate 110, and to electrically isolate neighboring devices (e.g. transistors) from one another. The isolation structure 120 surrounds the active regions 112. The isolation structure 120 may be made of a dielectric material, such as silicon oxide, silicon nitride, silicon oxynitride, fluoride-doped silicate glass (FSG), a low-K dielectric material, other suitable materials, or combinations thereof. The isolation structure 120 may be formed by using an isolation technology, such as local oxidation of semiconductor (LOCOS), shallow trench isolation (STI), or the like.

In some embodiments, the formation of the isolation structure 120 includes patterning the semiconductor substrate 110 by a photolithography process, etching a trench in the semiconductor substrate 110 (for example, by using a dry etching, wet etching, or plasma etching process, or a combination thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 1A, a gate dielectric layer 130 and a gate 140 are formed over the active regions 112 of the semiconductor substrate 110. The gate dielectric layer 130 may be made of silicon oxide, silicon oxynitride, a high dielectric constant material (high-k material), or a combination thereof. The gate 140 may be made of polysilicon or other suitable materials.

Thereafter, lightly doped regions 114 are formed in the semiconductor substrate 110 by using a suitable process, such as an ion implantation process. The ion implantation process may use the gate 140 as a mask, and the lightly doped regions 114 are at two opposite sides of the gate 140. The lightly doped regions 114 may be a lightly doped source region and a lightly doped drain (LDD) region. The dopants used in the ion implantation process may include boron or phosphorus. Afterwards, a cleaning process is performed to clean away the residues formed in the ion implantation process. The cleaning process includes soaking the semiconductor substrate 110 and the gate 140 in a cleaning solution (e.g. an acid solution).

As shown in FIG. 1B, since the gate length L of the gate 140 is very short (e.g. shorter than 100 nm), the gate 140 tends to collapse in the ion implantation process if the ion implantation process is not properly performed. Besides, the gate 140 tends to collapse in the cleaning process due to the surface tension of the cleaning solution. Therefore, it is desirable to find alternative mechanisms for solving the problem mentioned above.

FIGS. 2A-2I are cross-sectional views of various stages of a process for forming a semiconductor device, in accordance with some embodiments. FIGS. 3A-3G are top views of the structures shown in FIGS. 2A-2F and 2I, respectively. FIGS. 2A-2F and 2I are cross-sectional views of the structures along sectional lines 2A-2A, 2B-2B, 2C-2C, 2D-2D, 2E-2E, 2F-2F and 2I-2I shown in FIGS. 3A-3G, respectively.

Figure 2A:
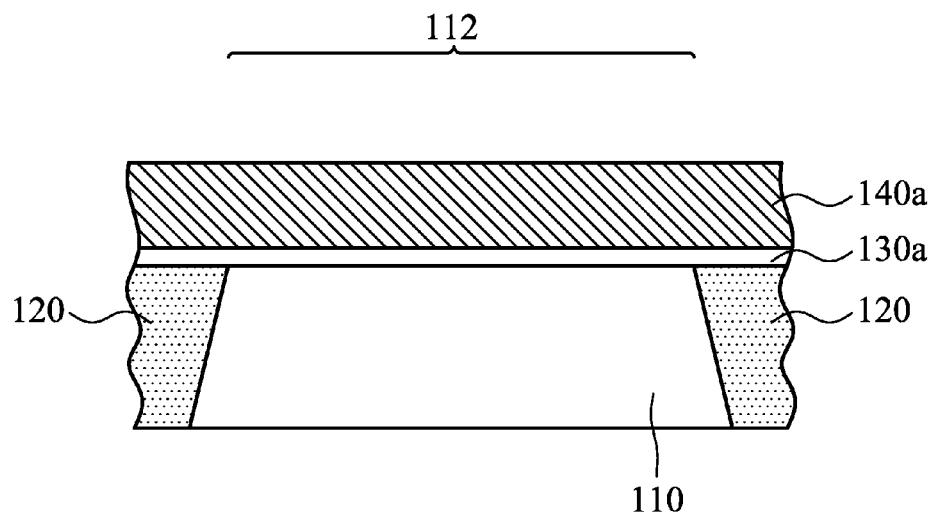
FIGS. 2A-2I are cross-sectional views of various stages of a process for forming a semiconductor device, in accordance with some embodiments.
Figure 3A:
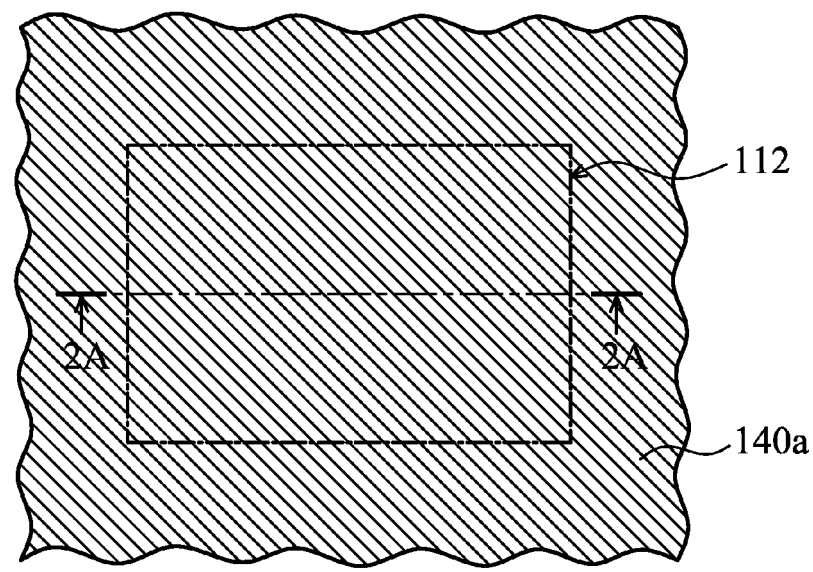
FIGS. 3A-3G are top views of the structures shown in FIGS. 2A-2F and 2I, respectively.

As shown in FIGS. 2A and 3A, a semiconductor substrate 110 is provided. An isolation structure 120 is formed in the semiconductor substrate 110 to define various active regions 112 of the semiconductor substrate 110, and to electrically isolate neighboring devices (e.g. transistors) from one another. A gate dielectric material layer 130a is deposited over the semiconductor substrate 110 by, for example, a chemical vapor deposition process (CVD process). Thereafter, a gate material layer 140a is deposited over the gate dielectric material layer 130a by, for example, a CVD process.

Figure 2B:
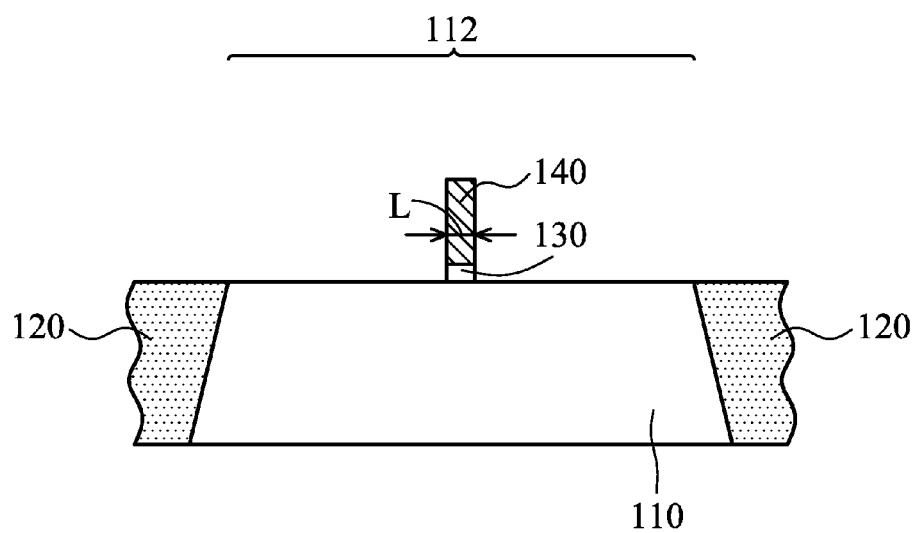
Figure 3B:
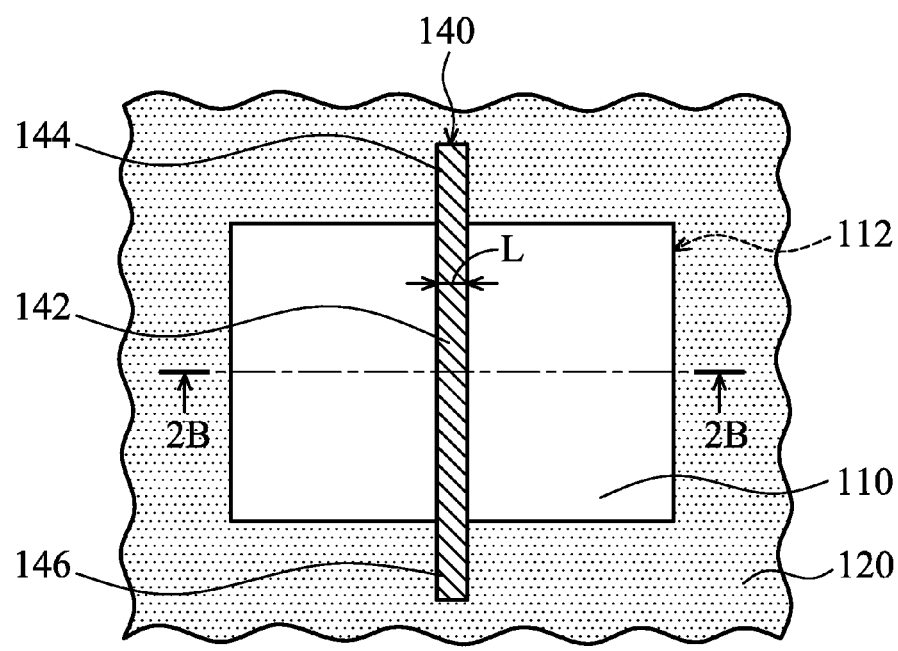

As shown in FIGS. 2B and 3B, a patterning process is performed to pattern the gate material layer 140a and the gate dielectric material layer 130a so as to form a gate 140 and a gate dielectric layer 130 under the gate 140. The gate 140 may extend across the active region 112 onto the isolation structure 120 surrounding the active region 112.

The gate 140 has an intermediate portion 142 over the active region 112 and two opposite end portions 144 and 146 over the isolation structure 120. The intermediate portion 142 is connected between the end portions 144 and 146. In some embodiments, the intermediate portion 142 and the end portions 144 and 146 have substantially the same gate length L. In some embodiments, the gate length L is shorter than or equal to about 100 nm (e.g., shorter than 60 nm, 50 nm, 40 nm, 30 nm or 20 nm). In some other embodiments, the gate length L is longer than about 100 nm. In some embodiments, the gate 140 is in a straight-line shape.

Figure 2C:
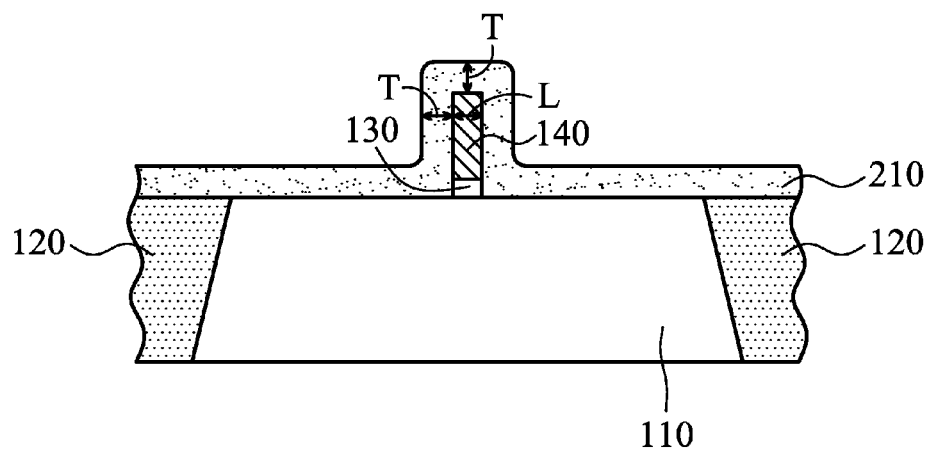
Figure 3C:
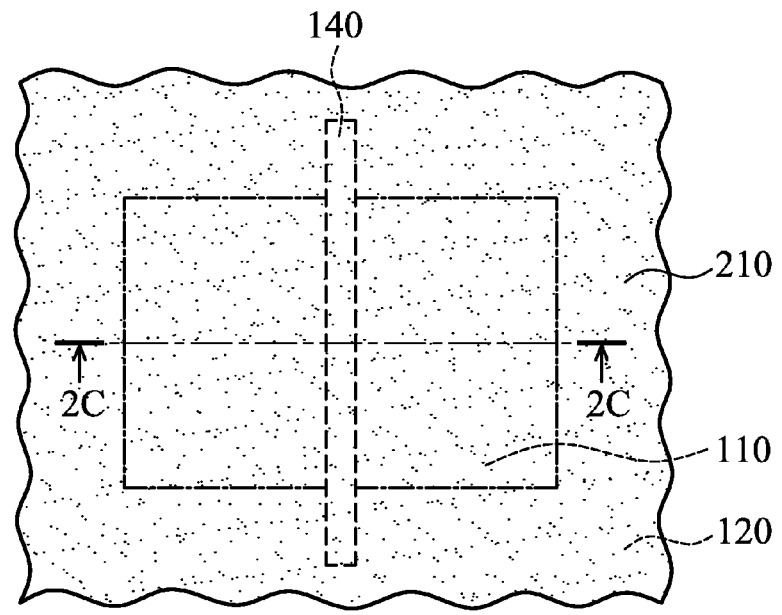

Thereafter, as shown in FIGS. 2C and 3C, a support film 210 may be deposited on the semiconductor substrate 110 to continuously cover the gate 140 and the isolation structure 120. In some embodiments, the support film 210 conformally covers the gate 140 and the isolation structure 120. The support film 210 includes silicon oxides ($SiO_2$), silicon oxynitrides (SiON), silicon nitrides (SiN), silicon carbonitrides (SiCN), or other suitable insulating materials. The deposition of the support film 210 includes, for example, a CVD process or a physical vapor deposition process (PVD process).

In some embodiments, the thickness T of the support film 210 ranges from about 5 Å to about 5000 Å. In some embodiments, the thickness T of the support film 210 ranges from about 5 Å to about 1000 Å. In some embodiments, the thickness T of the support film 210 ranges from about 5 Å to about 500 Å. In some embodiments, the thickness T of the support film 210 is substantially the same as the gate length L of the gate 140.

Figure 2D:
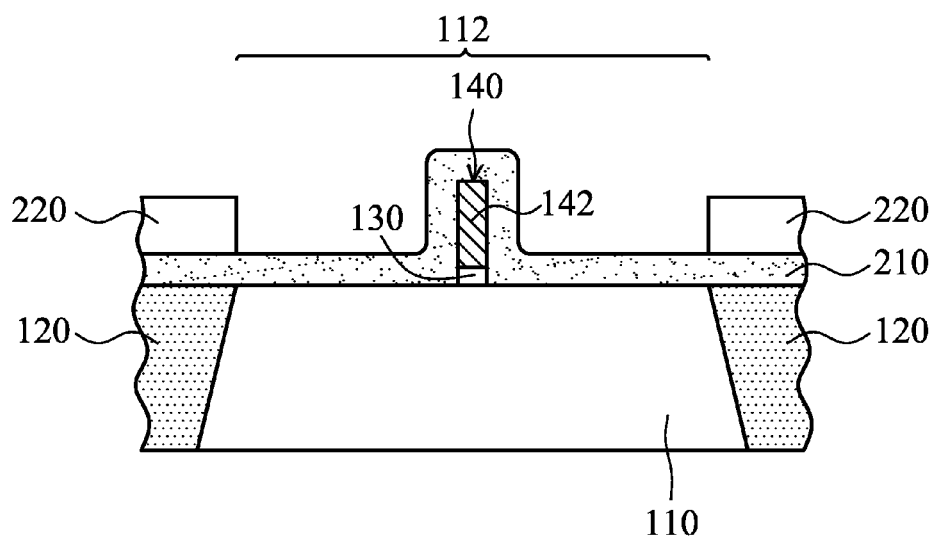
Figure 2E:
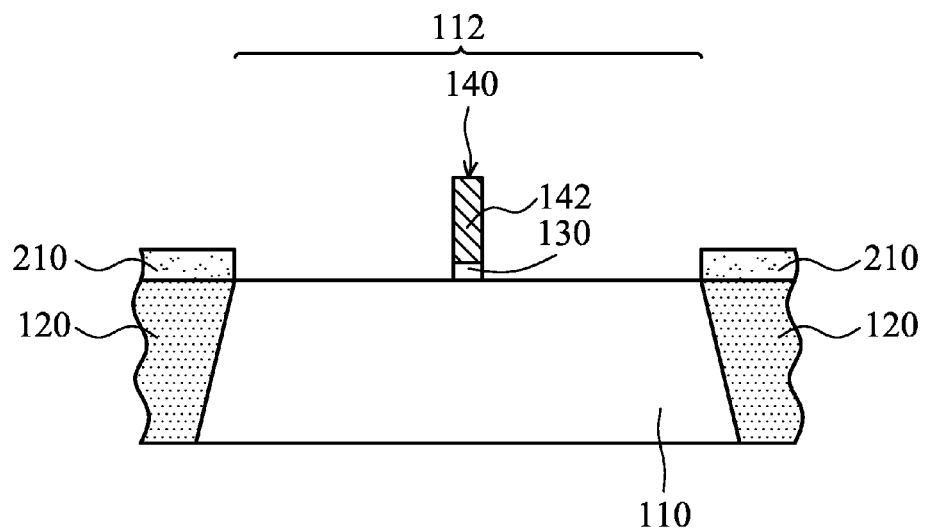
Figure 3D:
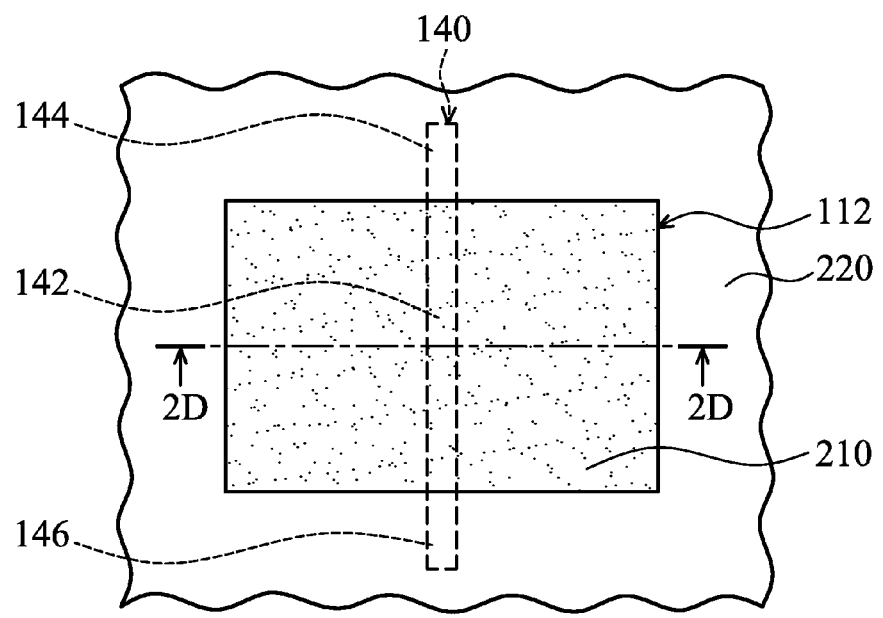
Figure 3E:
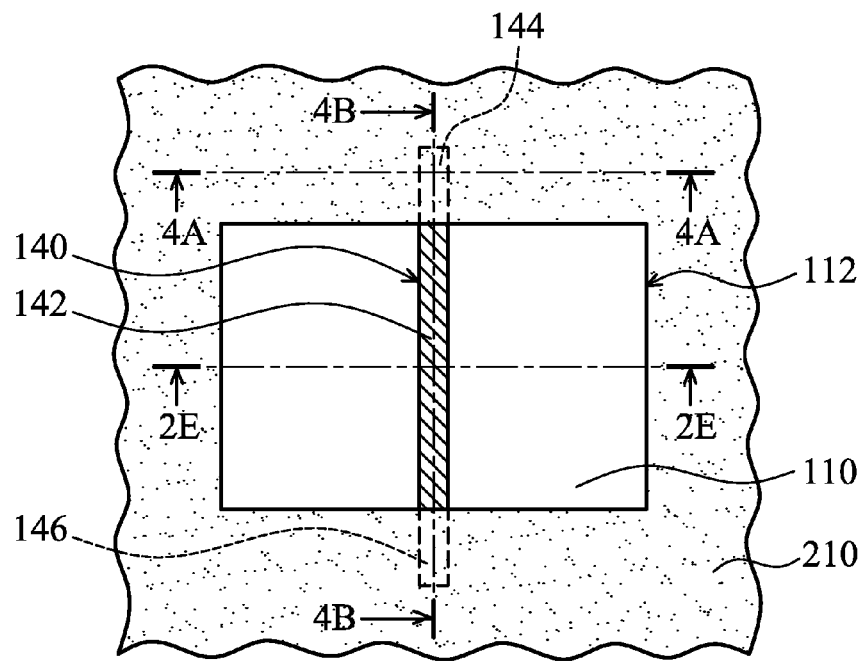

Afterwards, as shown in FIGS. 2D and 3D, a photoresist layer 220 may be formed over a portion of the support film 210 over the isolation structure 120. The photoresist layer 220 exposes another portion of the support film 210 over the active region 112. Afterwards, as shown in FIGS. 2E and 3E, an etching process is performed to remove the exposed portion of the support film 210 over the active region 112 by using the photoresist layer 220 as an etching mask. The etching process includes, for example, a dry etching process or a wet etching process. Thereafter, the photoresist layer 220 is removed.

Figure 4A:
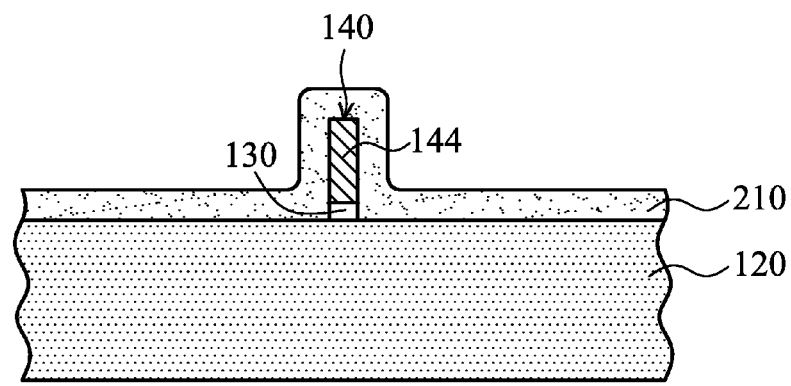
FIGS. 4A-4B are cross-sectional views of the structures along sectional lines 4A-4A and 4B-4B shown in FIG. 3E, respectively.
Figure 4B:
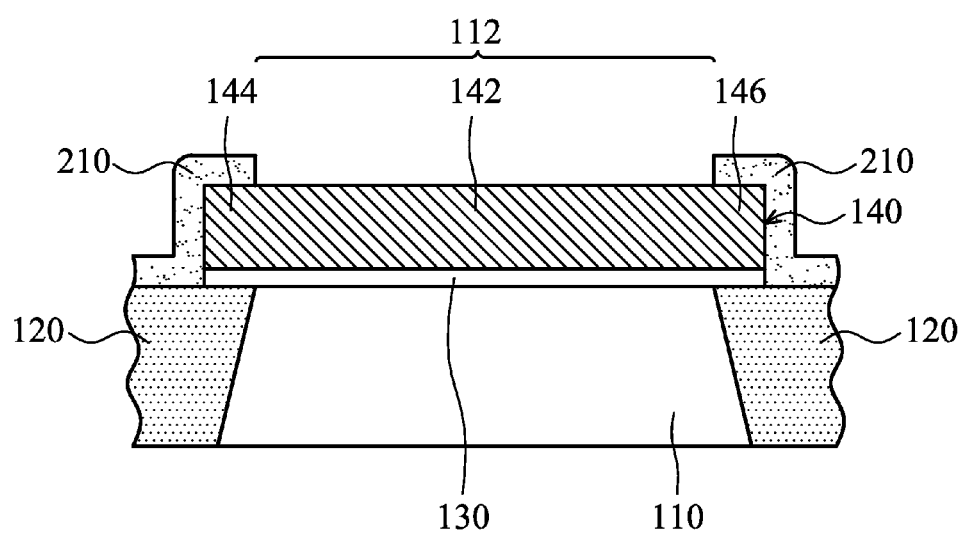

FIGS. 4A-4B are cross-sectional views of the structures along sectional lines 4A-4A and 4B-4B of FIG. 3E, respectively. As shown in FIGS. 3E, 4A and 4B, the support film 210 may continuously cover the isolation structure 120 and the end portions 144 and 146 of the gate 140 over the isolation structure 120. The support film 210 exposes the active region 112 and the intermediate portion 142 of the gate 140 over the active region 112.

The support film 210 continuously covering the end portions 144 and 146 and the isolation structure 120 may support the gate 140 to prevent the gate 140 form collapsing in the subsequent processes (such as ion implantation processes and/or cleaning processes).

Figure 2F:
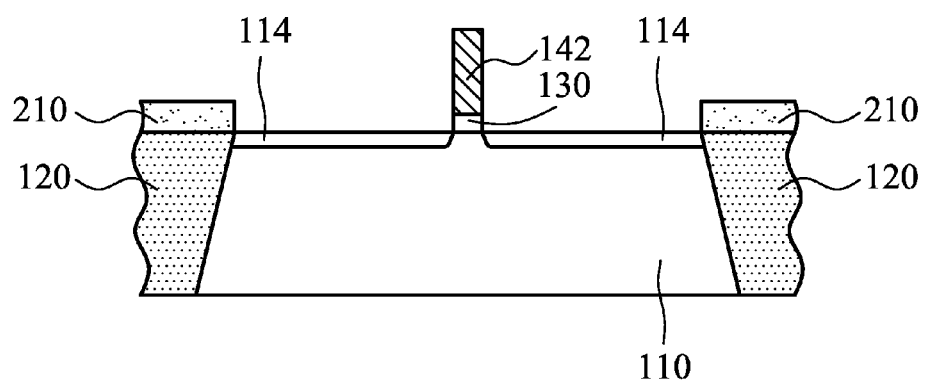
Figure 3F:
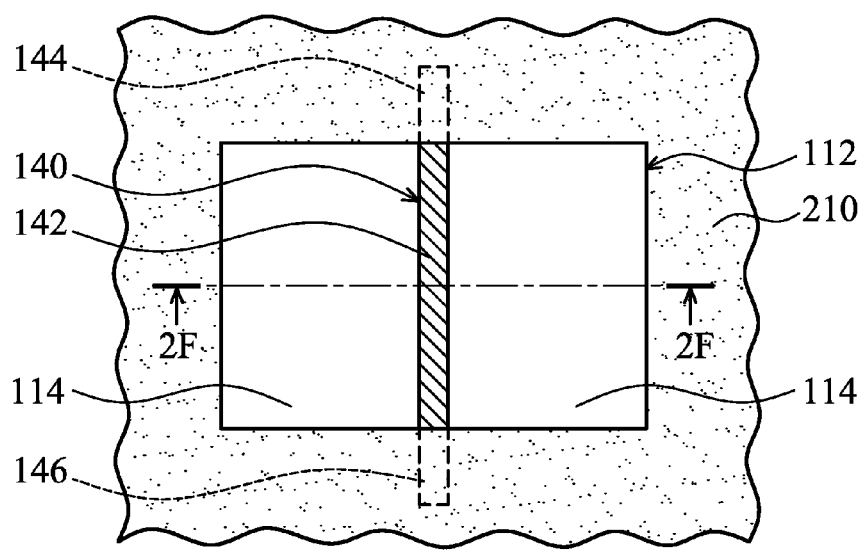

Thereafter, as shown in FIGS. 2F and 3F, lightly doped regions 114 are formed in the semiconductor substrate 110 by using a suitable process, such as an ion implantation process. The ion implantation process may be performed to introduce p-type impurities (e.g., boron) or n-type impurities (e.g., phosphorus) into the semiconductor substrate 110. The lightly doped regions 114 may be a lightly doped source region and a lightly doped drain (LDD) region. The lightly doped regions 114 may be located at two opposite sides of the intermediate portion 142. Afterwards, a cleaning process is performed to clean away the residues formed in the ion implantation process.

Figure 2G:
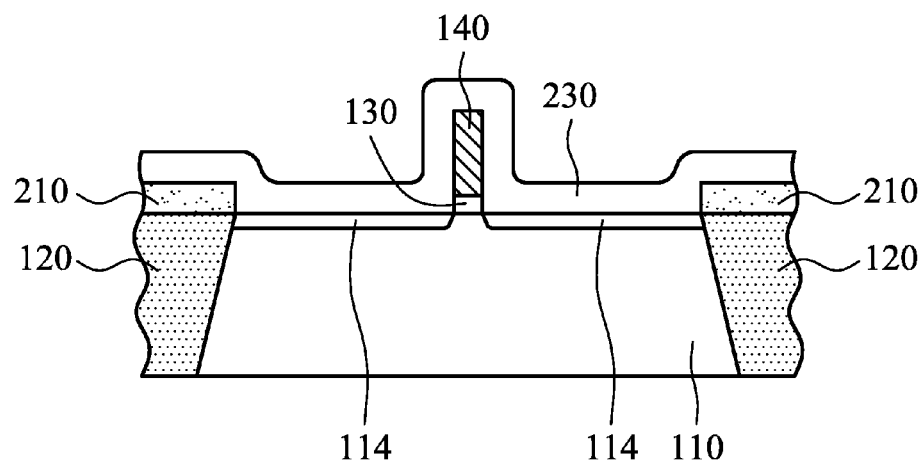

Afterwards, as shown in FIG. 2G, a spacer layer 230 may be deposited on the semiconductor substrate 110 by using, for example, a CVD process. The spacer layer 230 includes insulating materials, such as silicon oxides or silicon nitrides.

Thereafter, as shown in FIG. 214, an anisotropic etching process (e.g. a dry etching process) is performed to remove a portion of the spacer layer 230. The remaining spacer layer 230 is over the sidewalls 148 and 132 of the gate 140 and the gate dielectric layer 130. The remaining spacer layer 230 over the sidewalls 148 and 132 may be configured to electrically isolate the gate 140 from other devices and to act as a mask layer in a subsequent ion implantation process.

Figure 2H:
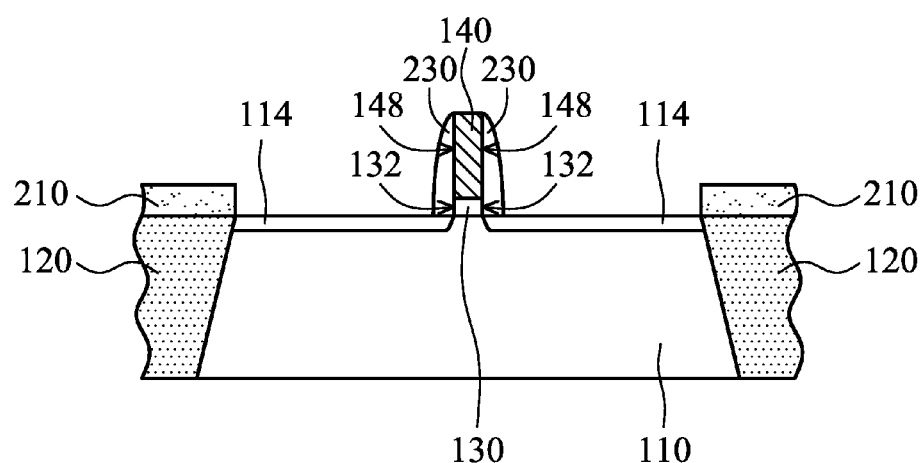
Figure 2I:
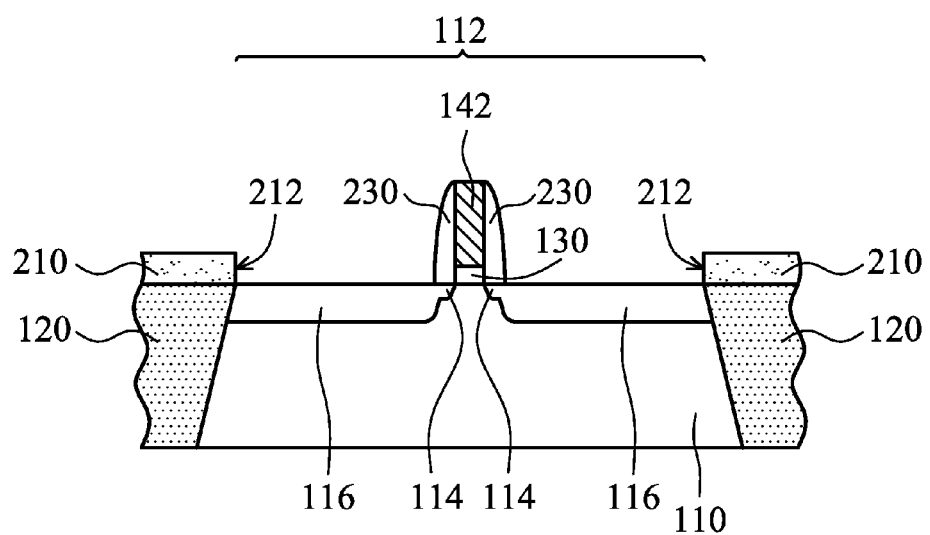
Figure 3G:
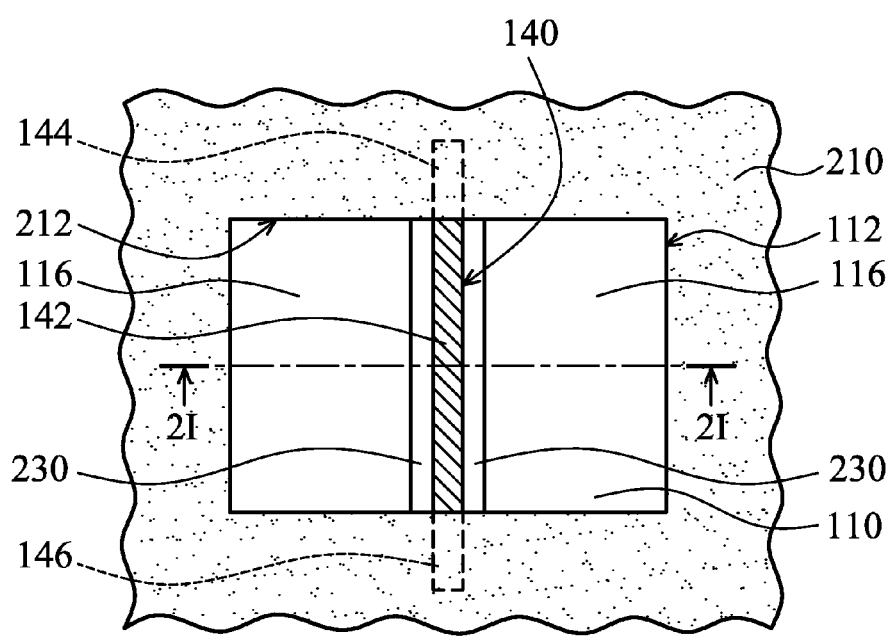

Thereafter, as shown in FIGS. 2I and 3G, heavily doped regions 116 are formed in the semiconductor substrate 110 by using a suitable process, such as an ion implantation process. The ion implantation process may be performed to introduce p-type impurities (e.g., boron) or n-type impurities (e.g., phosphorus) into the semiconductor substrate 110.

The heavily doped regions 116 may be a heavily doped source region and a heavily doped drain region. The heavily doped regions 116 may be located at the two opposite sides of the intermediate portion 142. The gate 140, the gate dielectric layer 130, the spacer layer 230, the lightly doped regions 114 and the heavily doped regions 116 may constitute a transistor device.

Figure 5:
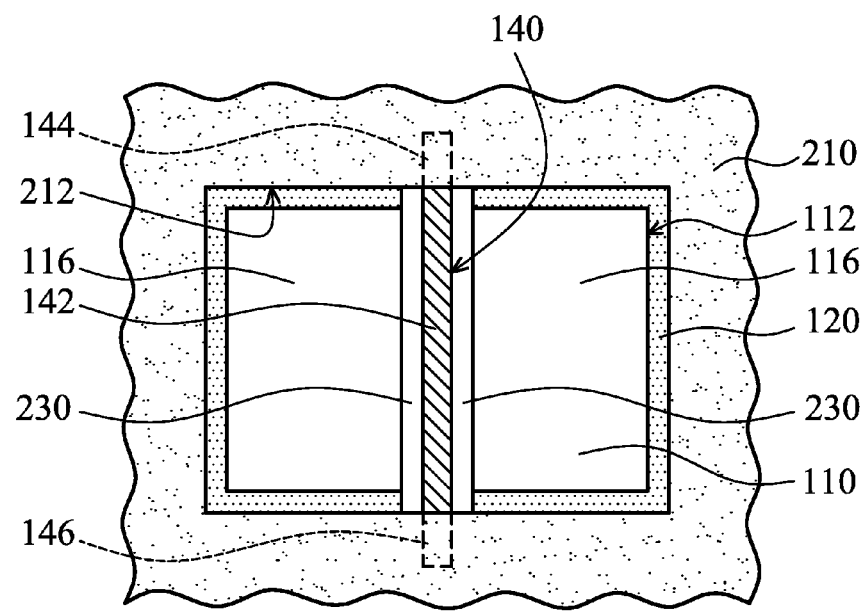
FIG. 5 is a top view of a semiconductor device, in accordance with some embodiments.

In some embodiments, the support film 210 surrounds the active region 112. In some embodiments, the support film 210 is a continuous film and continuously surrounds the active region 112. In some embodiments, the edge 212 of the support film 210 is aligned with the edge of the active region 112. In some embodiments, the edge 212 of the support film 210 is spaced from the edge of the active region 112 (as shown in FIG. 5). The support film 210 exposes the active region 112 and the intermediate portion 142 of the gate 140 to prevent the support film 210 from retarding the formation of the lightly doped regions 114 and the heavily doped regions 116.

Figure 6:
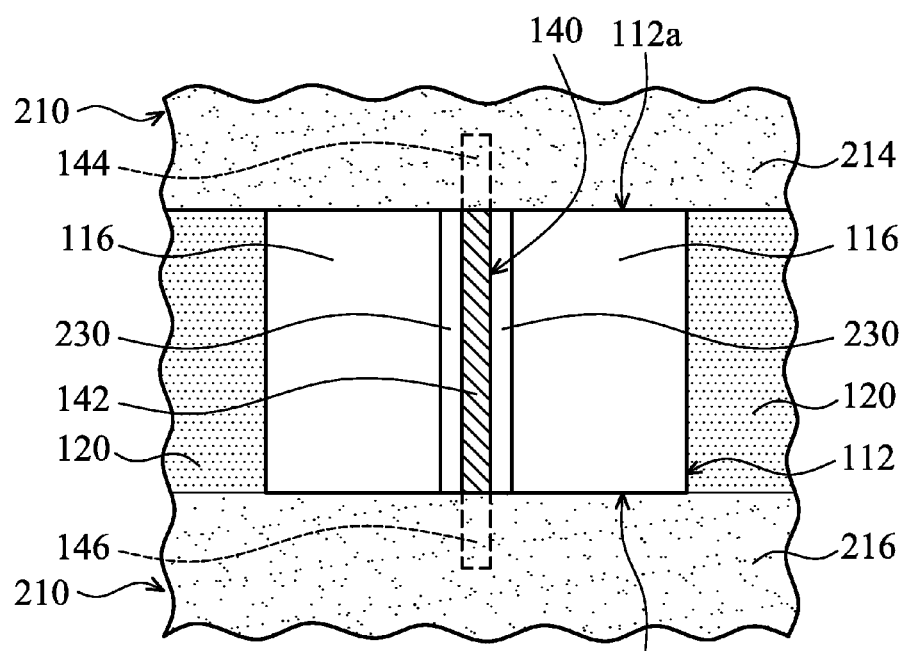
FIG. 6 is a top view of a semiconductor device, in accordance with some embodiments.
Figure 7:
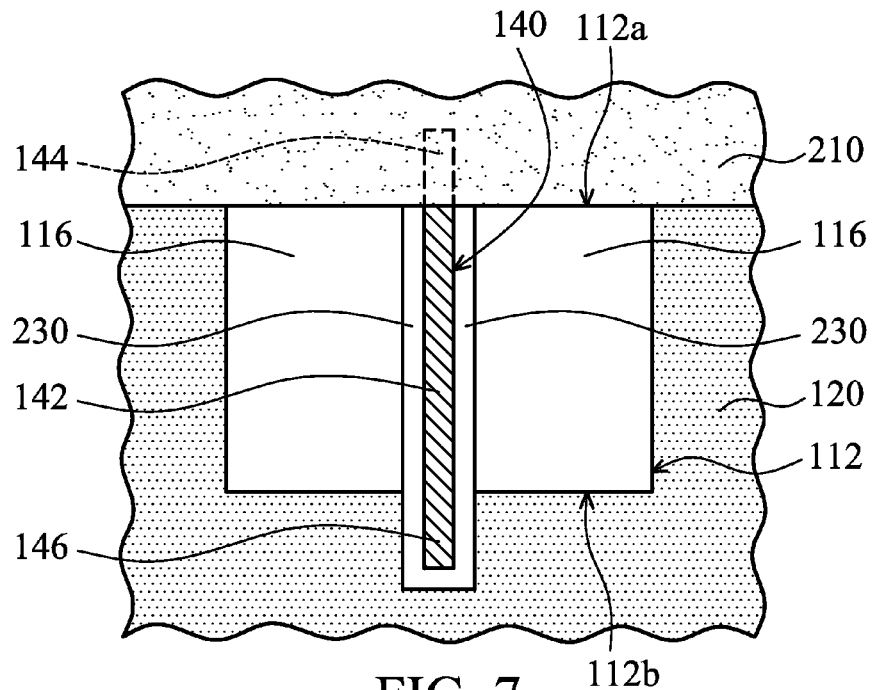
FIG. 7 is a top view of a semiconductor device, in accordance with some embodiments.

In some embodiments, the support film 210 covers the whole isolation structure 120 (as shown in FIG. 3G). In some other embodiments, the support film 210 merely covers a portion of the isolation structure 120 (as shown in FIGS. 6 and 7). The support film 210 may be, for example, in a bar shape (as shown in FIGS. 6 and 7).

As shown in FIG. 6, the support film 210 has two portions 214 and 216 separated from each other and located at two opposite sides 112a and 112b of the active region 112. The portion 214 continuously covers the isolation structure 120 and the end portion 144. The portion 216 continuously covers the isolation structure 120 and the end portion 146. As shown in FIG. 7, the support film 210 is located at only one side 112a of the active region 112 and continuously covers the isolation structure 120 and the end portion 144.

Figure 8:
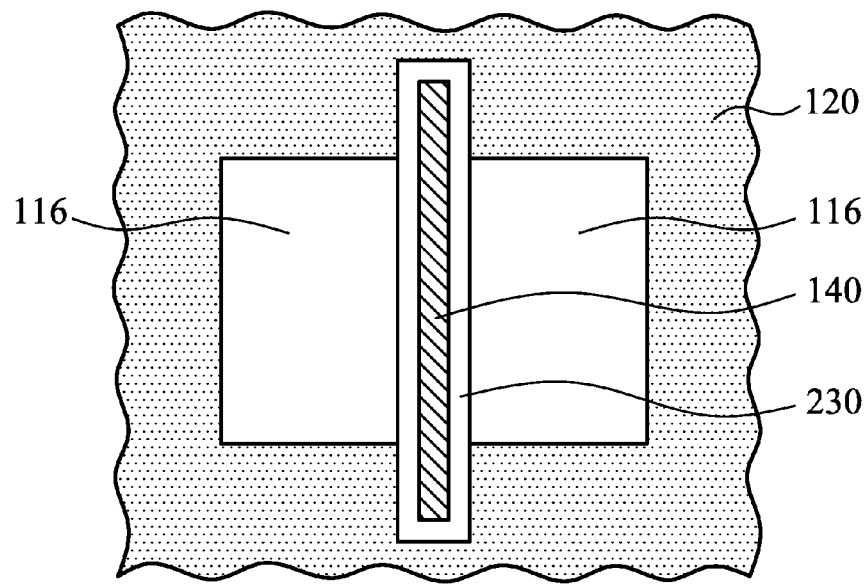
FIG. 8 is a top view of a semiconductor device, in accordance with some embodiments.

FIG. 8 is a top view of a semiconductor device, in accordance with some embodiments. As shown in FIG. 8, after the formation of the lightly doped regions 114 and the cleaning process (as shown in FIGS. 2F and 3F), the support film 210 may be removed, and then the steps of FIGS. 2G-2I are subsequently performed.

Embodiments of mechanisms for forming a semiconductor device as described above include forming a support film over an isolation structure in a semiconductor substrate to cover the isolation structure and at least one end portion of a gate over the isolation structure. Therefore, the support film may support the gate to prevent the gate from collapsing in the subsequent processes.

In accordance with some embodiments, a semiconductor device is provided. The semiconductor device includes a semiconductor substrate and an isolation structure in the semiconductor substrate and surrounding an active region of the semiconductor substrate. The semiconductor device also includes a gate over the semiconductor substrate, and the gate has an intermediate portion over the active region and two end portions connected to the intermediate portion, and the end portions are over the isolation structure. The semiconductor device further includes a support film over the isolation structure and covering the isolation structure and at least one of the end portions of the gate. The support film exposes the active region and the intermediate portion of the gate.

In accordance with some embodiments, a semiconductor device is provided. The semiconductor device includes a semiconductor substrate and an isolation structure, that is in the semiconductor substrate and surrounds an active region of the semiconductor substrate. The semiconductor device also includes a gate over the semiconductor substrate, and the gate has an intermediate portion over the active region, a first end portion and a second end portion. The first end portion and the second end portion are connected to the intermediate portion and are both over the isolation structure. The semiconductor device includes a support film over the isolation structure, and the support film has a first portion and a second portion separated from each other. The first portion continuously covers the isolation structure and the first end portion of the gate, and the second portion continuously covers the isolation structure and the second end portion of the gate.

In accordance with some embodiments, a method for forming a semiconductor device is provided. The method includes providing a semiconductor substrate and forming an isolation structure in the semiconductor substrate. The isolation structure surrounds an active region of the semiconductor substrate. The method also includes forming a gate over the semiconductor substrate, and the gate is across the active region and extends onto the isolation structure. The method further includes forming a support film over the isolation structure, wherein the support film covers the isolation structure and at least one end portion of the gate over the isolation structure. After the formation of the support film, the method includes forming lightly doped regions in the semiconductor substrate and at two opposite sides of the gate.

Although the embodiments and their advantages have been described in detail, it should be understood that various changes, substitutions, and alterations can be made herein without departing from the spirit and scope of the embodiments as defined by the appended claims Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
    a semiconductor substrate;
    an isolation structure in the semiconductor substrate and surrounding an active region of the semiconductor substrate;
    a gate extending along a lengthwise direction thereof and over the semiconductor substrate, wherein the gate has an intermediate portion over the active region and two end portions connected to the intermediate portion, the end portions are over the isolation structure, the gate has an upper surface and a lower surface opposite to the upper surface, and the lower surface is between the upper surface and the semiconductor substrate; and
    a support film over the isolation structure and covering the isolation structure, at least one of the end portions of the gate and a sidewall of the at least one of the two end portions of the gate, wherein the sidewall extends along a widthwise direction of the gate perpendicular to the lengthwise direction of the gate, wherein the support film exposes the active region and the intermediate portion of the gate, the support film covers a portion of the upper surface, the support film and the active region surrounded by the isolation structure do not overlap with each other, and the support film is a continuous film which continuously covers the isolation structure and both the end portions of the gate.

2. The semiconductor device as claimed in claim 1, wherein the semiconductor substrate has lightly doped regions at two opposite sides of the gate.

3. The semiconductor device as claimed in claim 1, wherein the support film comprises an insulating material.

4. The semiconductor device as claimed in claim 3, wherein the support film comprises silicon oxides, silicon oxynitrides, silicon nitrides or silicon carbonitrides.

5. The semiconductor device as claimed in claim 1, wherein a the thickness of the support film ranges from 5 Å to 5000 Å.

6. The semiconductor device as claimed in claim 1, wherein a the thickness of the support film ranges from 5 Å to 1000 Å.

7. The semiconductor device as claimed in claim 1, wherein a thickness of the support film is substantially the same as a gate length of the gate.

8. The semiconductor device as claimed in claim 1, wherein the support film continuously surrounds the active region.

9. The semiconductor device as claimed in claim 1, wherein the gate has a gate length shorter than or equal to 100 nm.

10. The semiconductor device as claimed in claim 1, wherein the support film has an opening exposing the intermediate portion of the gate and the active region.

11. The semiconductor device as claimed in claim 10, wherein a gate length of the gate is less than a width of the opening.

12. The semiconductor device as claimed in claim 10, wherein the opening further exposes a portion of the isolation structure.

13. The semiconductor device as claimed in claim 12, wherein the portion of the isolation structure exposed by the opening surrounds the active region.

14. A semiconductor device, comprising:
a semiconductor substrate;
an isolation structure in the semiconductor substrate and surrounding an active region of the semiconductor substrate;
a gate extending along a lengthwise direction thereof and over the semiconductor substrate, wherein the gate has an intermediate portion over the active region and two end portions connected to the intermediate portion, the end portions are over the isolation structure; and
a support film over the isolation structure and covering the isolation structure, at least one of the end portions of the gate and a sidewall of the at least one of the two end portions of the gate, wherein the sidewall extends along a widthwise direction of the gate perpendicular to the lengthwise direction of the gate, wherein the support film exposes the active region and the intermediate portion of the gate, the support film and the active region surrounded by the isolation structure do not overlap with each other, and the support film is a continuous film which continuously covers the isolation structure and both the end portions of the gate.

15. The semiconductor device as claimed in claim 14, wherein a thickness of the support film is substantially the same as a gate length of the gate.

16. The semiconductor device as claimed in claim 14, wherein the support film has an opening exposing the intermediate portion of the gate and the active region.

17. The semiconductor device as claimed in claim 14, wherein the support film comprises an insulating material.

18. A semiconductor device, comprising:
a semiconductor substrate;
an isolation structure in the semiconductor substrate and surrounding an active region of the semiconductor substrate;
a gate extending along a lengthwise direction thereof and over the semiconductor substrate, wherein the gate has an intermediate portion over the active region and two end portions connected to the intermediate portion, the end portions are over the isolation structure, the gate has an upper surface and a lower surface opposite to the upper surface, and the lower surface is between the upper surface and the semiconductor substrate; and
a support film over the isolation structure and covering the isolation structure, a sidewall of the at least one of the two end portions of the gate, wherein the sidewall extends along a widthwise direction of the gate perpendicular to the lengthwise direction of the gate, wherein the support film exposes the active region and the intermediate portion of the gate, the support film and the active region surrounded by the isolation structure do not overlap with each other, and the support film is a continuous film which continuously covers the isolation structure and both the end portions of the gate.

19. The semiconductor device as claimed in claim 18, wherein the support film covers a portion of the upper surface.

20. The semiconductor device as claimed in claim 18, wherein the support film has an opening exposing the intermediate portion of the gate and the active region.

* * * * *